(12) United States Patent
Nguyen et al.

(10) Patent No.: US 6,984,579 B2
(45) Date of Patent: Jan. 10, 2006

(54) ULTRA LOW K PLASMA CVD NANOTUBE/ SPIN-ON DIELECTRICS WITH IMPROVED PROPERTIES FOR ADVANCED NANOELECTRONIC DEVICE FABRICATION

(75) Inventors: Son Van Nguyen, Los Gatos, CA (US); Kang Sub Yim, Mountain View, CA (US)

(73) Assignee: Applied Materials, Inc., Santa Clara, CA (US)

(*) Notice: Subject to any disclaimer, the term of this patent is extended or adjusted under 35 U.S.C. 154(b) by 79 days.

(21) Appl. No.: 10/376,088

(22) Filed: Feb. 27, 2003

(65) Prior Publication Data

US 2004/0169281 A1 Sep. 2, 2004

(51) Int. Cl.
*H01L 21/4763* (2006.01)

(52) U.S. Cl. .................. 438/622; 438/618; 257/750; 257/758

(58) Field of Classification Search ......... 438/622–625, 438/617, 778, 780, 628; 257/750, 753
See application file for complete search history.

(56) References Cited

U.S. PATENT DOCUMENTS

| | | | | |
|---|---|---|---|---|
| 5,744,399 | A | * 4/1998 | Rostoker et al. | ............ 438/622 |
| 6,062,931 | A | 5/2000 | Chuang et al. | ............... 445/24 |
| 6,097,138 | A | * 8/2000 | Nakamoto | .................. 313/309 |
| 6,162,740 | A | 12/2000 | Morinaga | |
| 6,277,318 | B1 | * 8/2001 | Bower et al. | ............... 264/346 |
| 6,283,812 | B1 | * 9/2001 | Jin et al. | ....................... 445/24 |
| 6,286,226 | B1 | * 9/2001 | Jin | ............................... 33/706 |
| 6,287,979 | B1 | * 9/2001 | Zhou et al. | .................. 438/723 |
| 6,294,467 | B1 | * 9/2001 | Yokoyama et al. | ......... 438/680 |
| 6,297,063 | B1 | * 10/2001 | Brown et al. | .................. 438/2 |

(Continued)

FOREIGN PATENT DOCUMENTS

| | | |
|---|---|---|
| DE | 101 61 312 A1 | 7/2003 |
| WO | WO 02/17397 A1 | 2/2002 |

OTHER PUBLICATIONS

PCT International Search Report and Written Opinion for PCT/US2004/004741, dated Aug. 19, 2004 (AMAT/ 7991.PC).

Kloster, et al., "Porosity Effects on Low–K Dielectric Film Strength and Interfacial Adhesion" International Interconnect Technology Conference, Jun. 5, 2002. pp. 1–17.

Kamins, et al., "Chemically Vapor Deposited Si Nanowires Nucleated by Self–Assembled Ti Islands: Patterned and Unpatterned Si Substrates", MSS10, Linz, Austria, Jul. 23–27, 2001. pp. 1–12.

Paul S. Ho, "Material Issues and Impact on Reliablity of Cu/Low k Interconnects" Microelectronics Research Center, University of Texas at Austin, AVS Chapter, Oct. 2002. pp. 1–50.

M. Tanemura, et al., "Growth of Aligned Carbon Nanotubes by Plasma–Enhanced Chemical Vapor Deposition: Optimization of Growth Parameters", Journal of Applied Physics, vol. 90, No. 3, Aug. 1, 2001. pp.: 1529–1533.

U.S. Appl. No. 10/302,375, filed Nov. 22, 2002 (AMAT/ 7625).

*Primary Examiner*—Long Pham
*Assistant Examiner*—Thao X. Le
(74) *Attorney, Agent, or Firm*—Moser, Patterson & Sheridan

(57) ABSTRACT

A method for forming a conductive feature in a low k dielectric layer comprising a layer of nanotubes and a low k material between the nanotubes is provided. The low k dielectric layer may be deposited on a seed layer as a blanket layer that is patterned such that a conductive feature may be formed in the low k dielectric layer. Alternatively, the low k dielectric layer may be selectively deposited on a patterned seed layer between a sacrificial layer of a substrate. The sacrificial layer may be removed and replaced with conductive material to form a conductive feature in the low k dielectric layer.

34 Claims, 5 Drawing Sheets

U.S. PATENT DOCUMENTS

| | | | |
|---|---|---|---|
| 6,383,923 B1 * | 5/2002 | Brown et al. | 438/666 |
| 6,420,092 B1 * | 7/2002 | Yang et al. | 430/311 |
| 6,599,808 B2 * | 7/2003 | Kim et al. | 438/400 |
| 6,610,592 B1 | 8/2003 | Shue et al. | |
| 6,705,910 B2 * | 3/2004 | Sheu et al. | 445/24 |
| 6,706,402 B2 * | 3/2004 | Rueckes et al. | 428/408 |
| 2002/0024279 A1 | 2/2002 | Simpson et al. | 313/309 |
| 2002/0130407 A1 * | 9/2002 | Dahl et al. | 257/712 |
| 2002/0160111 A1 | 10/2002 | Sun et al. | 427/248 |
| 2003/0008123 A1 | 1/2003 | Glatkowski et al. | |
| 2003/0140959 A1 * | 7/2003 | Gaudiana et al. | 136/244 |
| 2003/0234407 A1 * | 12/2003 | Vogeli et al. | 257/183 |
| 2003/0236000 A1 * | 12/2003 | Vogeli et al. | 438/778 |
| 2004/0016928 A1 | 1/2004 | Ravi et al. | |
| 2004/0017009 A1 | 1/2004 | Shue et al. | |

* cited by examiner

ULTRA LOW K PLASMA CVD NANOTUBE/ SPIN-ON DIELECTRICS WITH IMPROVED PROPERTIES FOR ADVANCED NANOELECTRONIC DEVICE FABRICATION

BACKGROUND OF THE INVENTION

1. Field of the Invention

Embodiments of the present invention relate to the fabrication of integrated circuits. More particularly, embodiments of the present invention relate to a process for depositing and patterning a low k dielectric layer on a substrate.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 0.13 $\mu$m and even 0.1 $\mu$m feature sizes, and tomorrow's facilities soon will be producing devices having even smaller feature sizes.

The continued reduction in device geometries has generated a demand for films having lower k values because the capacitive coupling between adjacent metal lines must be reduced to further reduce the size of devices on integrated circuits. In particular, insulators having low dielectric constants (k), less than about 4.0, are desirable.

An effective method to reduce the k value is to introduce pores into dielectric films. As a result, low k films often have a low mechanical strength (e.g., hardness), which may hinder the integration of the films into the manufacture of the device. Plasma post treatment is currently being used to increase the mechanical strength of low k films. However, the plasma treatment causes the k value to increase.

Therefore, there remains a need for a method of forming and patterning low k dielectric layers with good mechanical properties.

SUMMARY OF THE INVENTION

The present invention generally provides a method of forming a conductive feature, including depositing a catalytic seed layer on a substrate, depositing a layer of nanotubes comprising carbon on the catalytic seed layer, forming an interconnect opening in the layer of nanotubes, and depositing a conductive material in the interconnect opening.

In one embodiment, after a layer of nanotubes is deposited on a catalytic seed layer of a substrate, a low k dielectric material is deposited such that at least a portion of the low k dielectric material is dispersed among the nanotubes. The nanotubes and the low k dielectric material form a low k dielectric layer that is then patterned and etched to form an interconnect opening. Conductive material is deposited in the interconnect opening to form a conductive feature.

In another embodiment, a sacrificial layer is deposited on a catalytic seed layer of a substrate. The sacrificial layer is patterned and etched to form an opening in the sacrificial layer that exposes regions of the catalytic seed layer. A layer of nanotubes is selectively deposited on the exposed regions of the catalytic seed layer, and a low k dielectric material is deposited on the substrate such that at least a portion of the low k dielectric material is dispersed among the nanotubes. The sacrificial layer is then removed, leaving an interconnect opening in its place. A conductive material is deposited in the interconnect opening.

A method of forming a dual damascene structure including one or more dielectric layers that are low k dielectric layers containing a layer of nanotubes and a low k dielectric material dispersed among the nanotubes is also provided.

Structures including a low k dielectric layer comprising a layer of nanotubes, wherein the layer of nanotubes is in a matrix of a low k dielectric material, are also provided.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1A:
FIGS. 1A–1C illustrate a first embodiment of a substrate processing sequence.
Figure 1B:
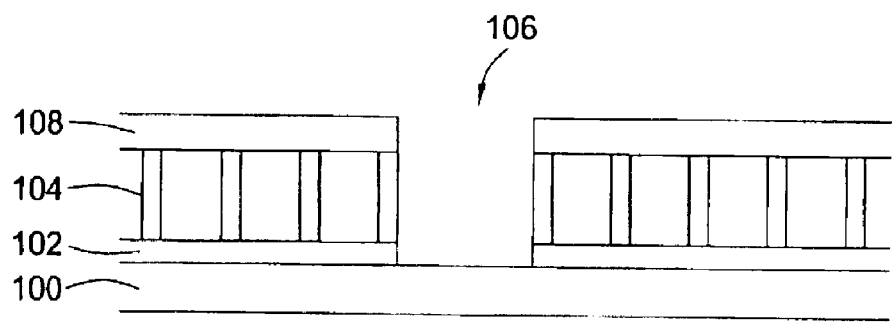
Figure 1C:
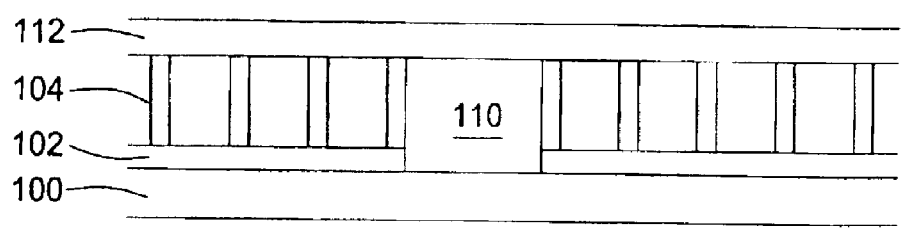

Aspects of the invention provide a method for forming a low k dielectric film that includes a layer of nanotubes comprising carbon, and forming a conductive feature in the low k dielectric film. As used herein, "substrate" is used to refer to the base layer upon which subsequent layers are deposited as well as to the structures formed that include the base layer. A layer of nanotubes 104 comprising carbon is deposited on a catalytic seed layer 102 on a substrate 100, as shown in FIG. 1A. An interconnect opening 106 is formed in the layer of nanotubes 104, as shown in FIG. 1B. The interconnect opening 106 may be formed by depositing a resist such as a photoresist 108 on the layer of nanotubes 104, patterning the photoresist 108, and etching the layer of nantotubes 104 using the photoresist as a mask. A conductive material 110 may be deposited in the interconnect opening, and optionally, a cap layer 112 is deposited on the layer of nanotubes 104 and the conductive material 110, as shown in FIG. 1C.

The substrate 100 may be a semiconductor layer, such as a layer comprising silicon, or a conductive layer, such as a layer comprising copper. The catalytic seed layer 102 may be a layer of a transition metal or a combination of transition metals. For example, the catalytic seed layer may comprise cobalt (Co), iron (Fe), nickel (Ni), titanium (Ti), or combinations thereof. The catalytic seed layer may be deposited by chemical vapor deposition (CVD), physical vapor deposition (PVD), a spin-on process, or combinations thereof. Preferably, the catalytic seed layer is deposited by CVD or PVD of Co, Ni, or Fe.

It is believed that the catalytic seed layer nucleates the growth of the layer of nanotubes 104 that is deposited on the catalytic seed layer. Typically, the layer of nanotubes is deposited by a CVD process, such as plasma enhanced CVD (PECVD). The layer of nanotubes may be deposited from a mixture comprising a hydrocarbon. For example, $CH_4$, $C_2H_2$, $C_2H_4$, or combinations thereof may be used as the hydrocarbon. The mixture may also include a nitrogen source, such as $N_2$, $NH_3$, or a combination thereof, and a carrier gas, such as hydrogen, argon, or helium. The height and density of the nanotubes can be controlled by varying the process conditions.

In one embodiment, the catalytic seed layer and the layer of nanotubes are deposited within an Endurae® or Producer® system, both of which are available from Applied Materials, Inc. of Santa Clara, Calif. A transition metal such as Co, Ni, or Fe may be sputtered with argon at a temperature of less than about 200° C. and a pressure of about $1 \times 10^{-5}$ Torr to about $1 \times 10^{-6}$ Torr to deposit the catalytic seed layer on a substrate in one chamber. The substrate may be transferred to another chamber for PECVD of the layer of nanotubes, such as by using a flow of about 10 sccm to about 100 sccm of $C_2H_2$, a flow of about 5 sccm to about 50 sccm of $NH_3$, a flow ratio of $C_2H_2/NH_3$ of about 0.2 to about 0.4, a pressure of about 10 mTorr to about 3000 mTorr, and a temperature of about 350° C. to about 475° C. Preferably, the nanotubes have a diameter of about 20 nanometers to about 50 nanometers.

While FIGS. 1B and 1C show the catalytic seed layer 102 remaining intact after the deposition of the layer of nanotubes 104, it is believed that the catalytic seed layer may at least partially migrate into or through the nanotubes. For example, cobalt from a cobalt catalytic seed layer may move from the base of the nanotubes to the tip of the nanotubes. Alternatively, at least some of the cobalt may pass up and through the tip of the nanotubes such that some of the cobalt is no longer associated with the nanotubes. Thus, while FIGS. 1B and 1C and subsequent Figures herein show an intact catalytic seed layer after the deposition of the nanotubes, the catalytic layer may be more dynamic, as discussed above.

The patterned photoresist 108 shown in FIG. 1B may be deposited and patterned using conventional photoresist deposition and patterning techniques. The layer of nanotubes is then etched to create an interconnect opening. Typically, the photoresist 108 is then removed. A conductive material 110, such as a material comprising copper, is then deposited in the interconnect opening 106, as shown in FIG. 1C. The conductive material may be deposited by CVD, PVD, electroplating, electroless plating, or combinations thereof. Optionally, a barrier layer and/or a seed layer is deposited in the interconnect opening before the conductive material is deposited. For example, a tantalum or tantalum nitride barrier layer and/or a copper seed layer may be deposited. Generally, the substrate is planarized, such as by chemical mechanical planarization, after the conductive material is deposited. Optionally, a cap layer 112 is then deposited on the substrate. The cap layer may be a silicon oxide layer or another dielectric layer. The methods and materials described herein to deposit the conductive material, the barrier layer, and the seed layer may be used in any of the embodiments described below.

In a preferred embodiment, the method described above with respect to FIGS. 1A–1C also includes depositing a low k dielectric material such that at least a portion of the low k dielectric material is deposited between adjacent nanotubes before the interconnect opening is formed. Thus, a low k dielectric film comprising a layer of nanotubes comprising carbon, wherein the layer of nanotubes is in a matrix of the low k dielectric material, is formed. Such an embodiment will be described with respect to FIGS. 2 and 3.

Figure 2A:
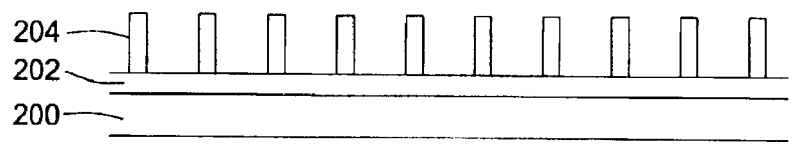
FIGS. 2A–2E illustrate a second embodiment of a substrate processing sequence.
Figure 2B:
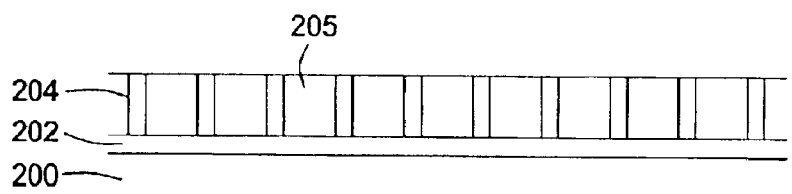
Figure 3:
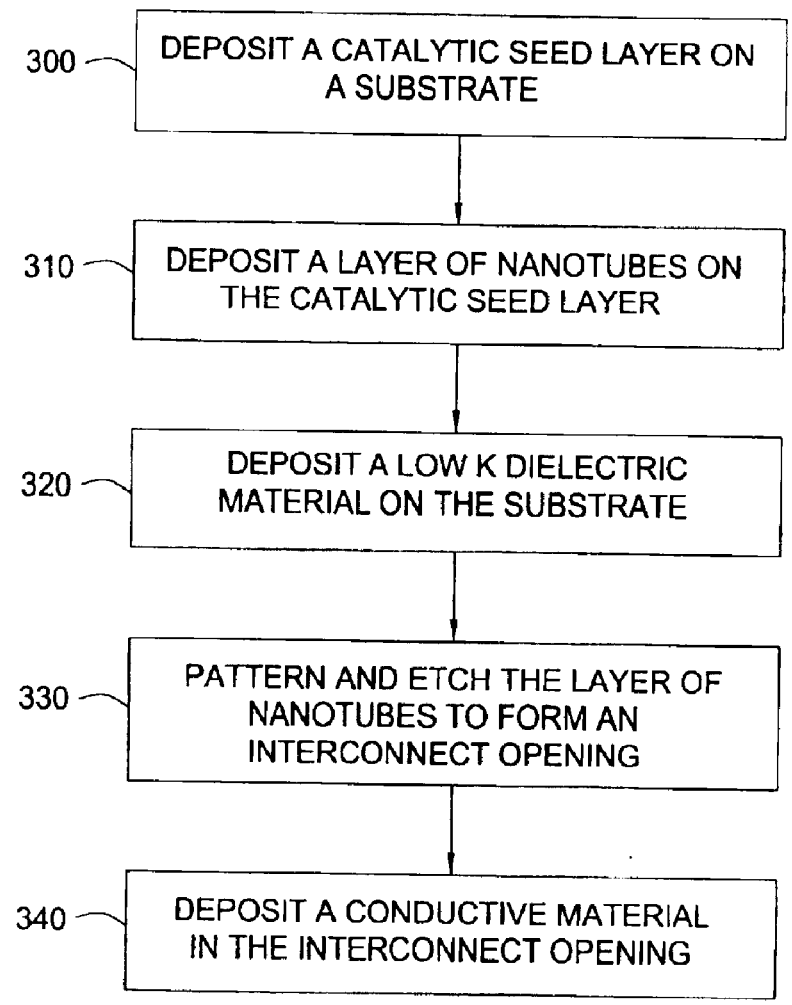
FIG. 3 is a flow chart illustrating a second embodiment of a substrate processing sequence.

A catalytic seed layer 202 is deposited on a substrate 200, and a layer of nanotubes 204 comprising carbon is deposited on the catalytic seed layer 202, as shown in FIG. 2A and described in steps 300 and 310 of FIG. 3. The catalytic seed layer 202 and the layer of nanotubes may be deposited using the same materials and methods described above with respect to the catalytic seed layer 102 and the layer of nanotubes 104 of FIG. 1A. A low k dielectric material 205 is then deposited on the substrate, as shown in FIG. 2B and described in step 320 of FIG. 3. As shown in FIG. 2B, the low k dielectric material 205 is deposited such that at least a portion of the low k dielectric material is deposited among the nanotubes, e.g., between adjacent nanotubes. Preferably, the low k dielectric material is deposited by a spin-on process. Preferably, the low k dielectric material is a porous material, such as a porous oxide comprising silicon, e.g., a porous carbon-doped silicon oxide. Examples of porous low k materials that may be used include p-SiLK® dielectric material, available from Dow Chemical Company, Orion™ insulating material, available from Trikon, LKD 5109, available from JSR, and XPX, available from Asahi. The porous low k material can be a xerogel and/or an extremely low k (eLK, i.e., having a dielectric constant of about 1.8 to about 2.6) dielectric material.

Typically, after the low k dielectric material is deposited, the substrate is planarized. Optionally, the substrate may also be treated with a reactive ion etching process to remove excess material deposited on the substrate. Also, optionally, the substrate may be treated with an electron beam to strengthen the layer of nanotubes and the low k dielectric material. Preferably, the low k dielectric film is transferred to another chamber without breaking vacuum for an electron beam treatment. An electron beam treatment and chamber for low k dielectric films is described in commonly assigned U.S. patent application Ser. No. 10/302,375, entitled "Method For Forming Ultra Low K Films Using Electron Beam," filed on Nov. 22, 2002, which is incorporated herein by reference. In one embodiment, the electron beam treatment has a dose between about 50 and about 2000 micro coulombs per square centimeter ($\mu c/cm^2$) at about 1 to 20 kiloelectron volts (KeV). The electron beam treatment is typically operated at a temperature between about room-temperature and about 450° C. for about 1 minute to about 15 minutes, such as about 2 minutes. Preferably, the electron beam treatment is performed at about 400° C. for about 2 minutes. In one aspect, the electron beam treatment conditions include 4.5 kV, 1.5 mA, and 500 $\mu c/cm^2$ at 400° C. Although any electron beam device may be used, one exemplary device is the EBK chamber, available from Applied Materials, Inc.

Figure 2C:
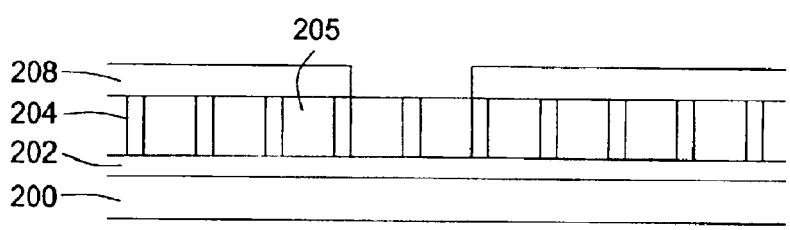
Figure 2D:
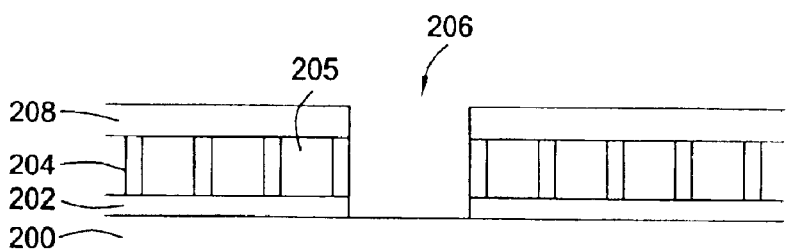
Figure 2E:
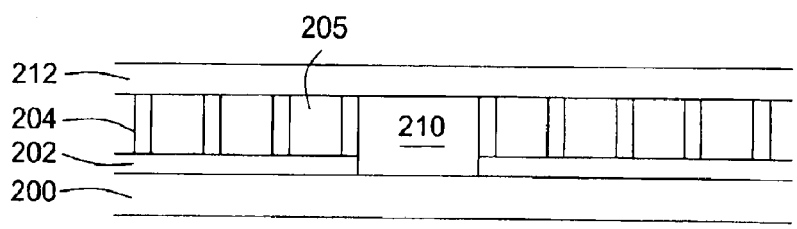

The layer of nanotubes is then patterned and etched to form an interconnect opening, as described in step 330 of FIG. 3. The layer of nanotubes may be patterned and etched by depositing and patterning a resist such as a photoresist 208 on the layer of nanotubes, as shown in FIG. 2C, and etching through the layer of nanotubes to create an interconnect opening 206, as shown in FIG. 2D. The catalytic seed layer 202 may be etched through, if it is still present, by a chlorine-based plasma etching process. Typically, the photoresist 208 is then removed. A conductive material 210, such as a material comprising copper, is then deposited in the interconnect opening 206, as shown in FIG. 2E and described in step 340 of FIG. 3. Optionally, a barrier layer and/or a seed layer (not shown) is deposited in the interconnect opening before the conductive material is deposited, as described above with respect to the embodiment illustrated in FIGS. 1A–1C. Generally, the substrate is planarized, such as by chemical mechanical planarization, after the conductive material is deposited. Optionally, a cap layer 212 is then deposited on the substrate. The cap layer may be a silicon oxide layer or another dielectric layer.

The embodiment shown and described above with respect to FIGS. 2A–2E and FIG. 3 is an example of a process that includes a blanket deposition of a layer of nanotubes on a catalytic seed layer. However, an embodiment of the method described herein may also be performed using a selective deposition of a layer of nanotubes on a catalytic seed layer. The same materials and processes described above with respect to the blanket deposition may be used for the deposition of the catalytic seed layer, the layer of nanotubes, and the low k dielectric material in the selective deposition embodiment described below. An example of such an embodiment will be described with respect to FIGS. 4A–4F and FIG. 5.

Figure 4A:
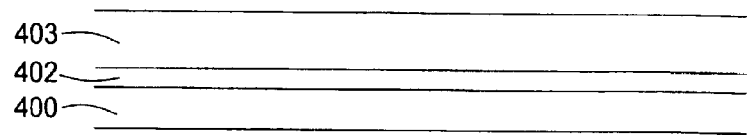
FIGS. 4A–4F illustrate a third embodiment of a substrate processing sequence.
Figure 4B:
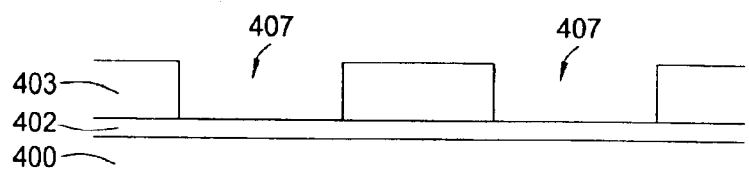
Figure 4C:
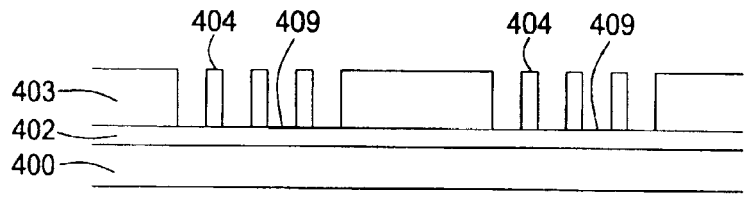
Figure 4D:
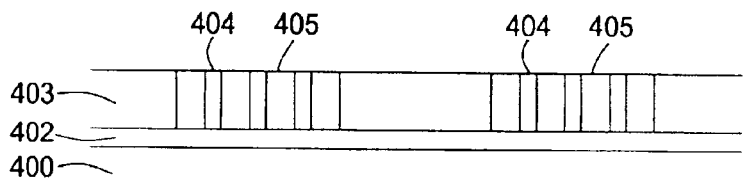
Figure 5:
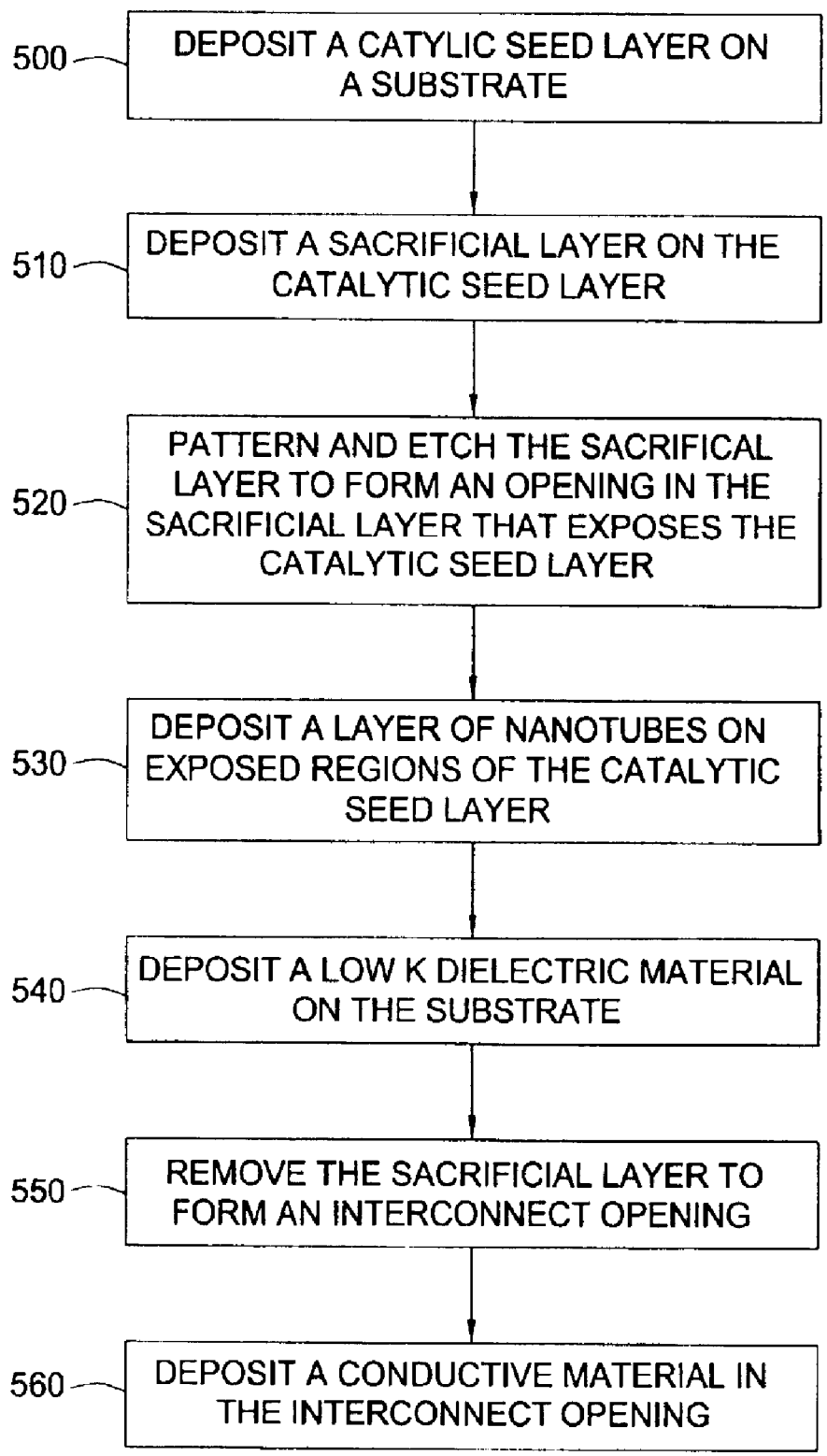
FIG. 5 is a flow chart illustrating a third embodiment of a substrate processing sequence.

A catalytic seed layer 402 is deposited on a substrate 400, and a sacrificial layer 403 is deposited on the catalytic seed layer, as shown in FIG. 4A and described in steps 500 and 510 of FIG. 5. The sacrificial layer can be a resist, an organosilicon glass deposited by a spin on process, or a silicon oxide layer deposited by PECVD. The sacrificial layer 403 is then patterned and etched to form openings 407 in the sacrificial layer that expose the catalytic seed layer, as shown in FIG. 4B and described in step 520 of FIG. 5. The sacrificial layer may be patterned and etched by depositing a resist on the sacrificial layer, patterning the resist, and etching the sacrificial layer using conventional resist and etching techniques. A layer of nanotubes 404 comprising carbon is then deposited on the exposed regions 409 of the catalytic seed layer, as shown in FIG. 4C and described in step 530 of FIG. 5. A low k dielectric material 405 is then deposited on the substrate such that at least a portion of the low k dielectric material is deposited between adjacent nanotubes, as shown in FIG. 4D and described in step 540 of FIG. 5.

Typically, after the low k dielectric material is deposited, the substrate is planarized. Optionally, the substrate may also be treated with a reactive ion etching process to remove excess material deposited on the substrate. Also, optionally, the substrate may be treated with an electron beam to strengthen the layer of nanotubes and the low k dielectric material.

Figure 4E:
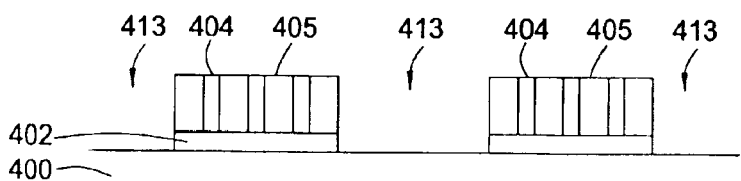
Figure 4F:
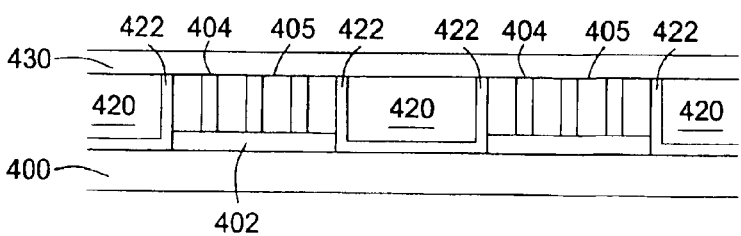

The sacrificial layer 403 is then removed to form interconnect openings 413, as shown in FIG. 4E and described in step 550 of FIG. 5. The sacrificial layer may be removed by a wet etching process or a reactive ion etching process that removes the sacrificial layer but does not remove a substantial amount of the low k dielectric material and the layer of nanotubes. The catalytic seed layer underneath the sacrificial layer, if still present, may be removed by a wet etch process. A conductive material 420, such as a material comprising copper or aluminum, is then deposited in the interconnect openings 413, as shown in FIG. 4F and described in step 560 of FIG. 5. Optionally, a barrier layer and/or a seed layer 422 is deposited in the interconnect opening before the conductive material is deposited. Generally, the substrate is planarized, such as by chemical mechanical planarization, after the conductive material is deposited. Optionally, a cap layer 430 is then deposited on the substrate. The cap layer may be a silicon oxide layer or another dielectric layer.

Figure 6:
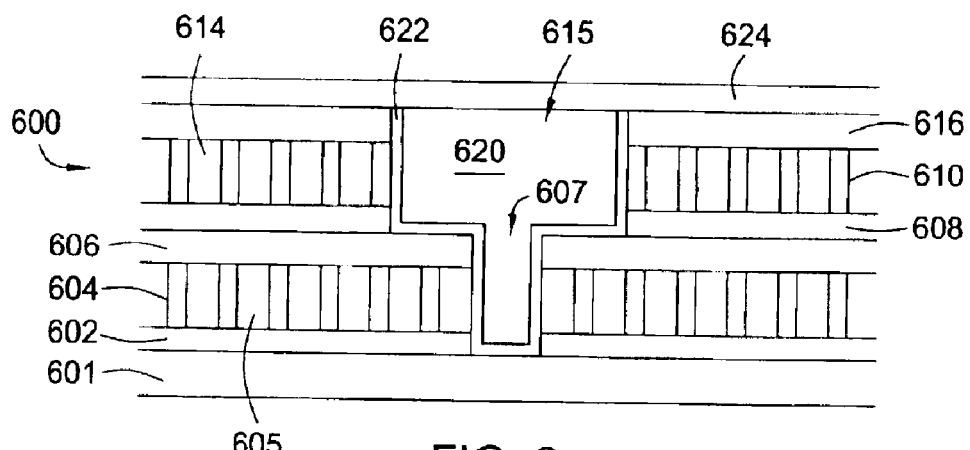
FIG. 6 illustrates an embodiment of a dual damascene structure.

The layer comprising nanotubes and a low k dielectric material may be used as one or both of the dielectric layers in a dual damascene structure. FIG. 6 shows an example of a dual damascene structure 600 in which both of the dielectric layers comprise the nanotubes and the low k dielectric material described herein. A first layer of nanotubes 604 comprising carbon is deposited on a first catalytic seed layer 602 deposited on a substrate 601, and a first low k material 605 is deposited on the substrate as described above with respect to FIGS. 2A–2E and FIG. 3. An etch stop 606 is deposited on the substrate and patterned to define a vertical interconnect opening 607. The etch stop 606 may be a silicon nitride layer, a silicon oxide layer, or any layer that has different etching characteristics than the dielectric layers deposited above and below the etch stop. A second catalytic seed layer 608, a second layer of nanotubes 610, and a second low k dielectric material 614 are then deposited on the substrate as described above with respect to FIGS. 2A–2E and FIG. 3. Also, as described above, after the deposition of each low k dielectric material, the substrate may be planarized, treated with a reactive ion etching process, and/or treated with an electron beam.

A horizontal interconnect opening 615 is then patterned in the second layer of nanotubes and the second low k dielectric material, such as by depositing and patterning a resist (not shown) or hard mask 616 through the second layer of nanotubes and the second low k dielectric material. The substrate is then etched to form a horizontal interconnect and a vertical interconnect. Preferably, if a resist is used to pattern the second low k dielectric material, the resist is removed after the etching to form the interconnects. A conductive material 620, such as a material comprising copper, is then deposited in the interconnects 206. Optionally, a barrier layer and/or a seed layer 622 is deposited in the interconnect opening before the conductive material is deposited. Generally, the substrate is planarized, such as by chemical mechanical planarization, after the conductive material is deposited. Optionally, a cap layer 624 is then deposited on the substrate. The cap layer may be a silicon oxide layer or another dielectric layer.

It is believed that the low k dielectric layers including a low k dielectric material dispersed among a layer of nanotubes provide low k dielectric films that have a desirable combination of low k and good mechanical properties. It is believed that the nanotubes act as reinforcing elements that strengthen low k materials that may be weak, such as porous low k materials. It is also believed that the low k dielectric material between the nanotubes may minimize current leakage that may occur between nanotubes in a dielectric layer that includes only nanotubes.

While the foregoing is directed to embodiments of the present invention, other and further embodiments of the invention may be devised without departing from the basic scope thereof, and the scope thereof is determined by the claims that follow.

What is claimed is:

1. A method of forming a conductive feature, comprising:
   depositing a catalytic seed layer on a substrate;
   depositing a layer of nanotubes comprising carbon on the catalytic seed layer;
   forming an interconnect opening in the layer of nanotubes;
   depositing a conductive material in the interconnect opening; and
   depositing a law k dielectric material such that at least a portion of the low k dielectric material is deposited between adjacent nanotubes to form a low k dielectric film comprising the layer of nanotubes comprising carbon in a matrix of the low k dielectric material before the forming an interconnect opening.

2. A method of forming a conductive feature, comprising:
depositing a catalytic seed layer on a substrate;
depositing a layer at nanotubes comprising carbon on the catalytic seed layer,
depositing a low k dielectric material such that at least a portion of the low k dielectric material is deposited between adjacent nanotubes;
patterning and etching through the layer of nanotubes to form an interconnect opening; and
depositing a conductive material in the interconnect opening.

3. The method of claim 2, further comprising planarizing the low k dielectric material and the layer of nanotubes before the patterning and etching through the layer of nanotubes.

4. The method of claim 2, further comprising treating the layer of nanotubes and the low k dielectric material with an electron beam.

5. The method of claim 2, wherein the depositing a low k dielectric material comprises a spin-on process.

6. The method of claim 2, wherein the low k dielectric material is a porous oxide comprising silicon.

7. The method of claim 2, wherein the catalytic seed layer is deposited by CVD, PVD, a spin-on process, or combinations thereof.

8. The method of claim 2, wherein the catalytic seed layer is selected from the group consisting of transition metals and combinations thereof.

9. The method of claim 2, wherein the catalytic seed layer comprises cobalt, iron, nickel, titanium, or combinations thereof.

10. The method of claim 2, wherein the layer of nanotubes is deposited by CVD.

11. The method of claim 2, wherein the layer of nanotubes is deposited from a mixture comprising a hydrocarbon.

12. The method of claim 2, wherein the conductive material comprises copper.

13. The method of claim 2, further comprising depositing a barrier layer in the interconnect opening before the depositing a conductive material.

14. A method of forming a conductive feature, comprising:
depositing a catalytic seed layer on a substrate;
depositing a sacrificial layer on the catalytic seed layer;
patterning and etching the sacrificial layer to form an opening in the sacrificial layer that exposes the catalytic seed layer;
depositing a layer of nanotubes comprising carbon on exposed regions of the catalytic seed layer;
depositing a low k dielectric material such that at least a portion of the low k dielectric material is deposited between adjacent nanotubes;
removing the sacrificial layer to form an interconnect opening; and
depositing a conductive material in the interconnect opening.

15. The method of claim 14, wherein the sacrificial layer comprises an insulating material.

16. The method of claim 14, wherein the patterning and etching the sacrificial layer comprises depositing a resist on the sacrificial layer, patterning the resist, and etching the sacrificial layer.

17. The method or claim 14, wherein the sacrificial layer is removed by a wet etching process.

18. The method of claim 14, wherein the sacrificial layer is removed by a plasma etching process.

19. The method of claim 14, further comprising treating the layer of nanotubes and the low k dielectric material with an electron beam.

20. The method of claim 14, wherein the depositing a low k dielectric material comprises a spin-on process.

21. The method of claim 14, wherein the low k dielectric material is a porous oxide comprising silicon.

22. The method of claim 14, wherein the catalytic seed layer is deposited by CVD, PVD, a spin-on process, or combinations thereof.

23. The method of claim 14, wherein the catalytic seed layer is selected from the group consisting of transition metals, and combinations thereof.

24. The method of claim 14, wherein the catalytic seed layer comprises cobalt, iron, nickel, titanium, or combinations thereof.

25. The method of claim 14, wherein the layer of nanotubes is deposited by CVD.

26. The method of claim 14, wherein the layer of nanotubes is deposited from a mixture comprising a hydrocarbon.

27. The method of claim 14, wherein the conductive material comprises copper.

28. The method of claim 14, further comprising depositing a barrier layer in the interconnect opening before the depositing a conductive material.

29. A method of forming a dual damascene structure, comprising:
depositing a first catalytic seed layer on a substrate;
depositing a first layer of nanotubes comprising carbon on the first catalytic seed layer,
depositing a first low k dielectric material such that at least a portion of the first low k dielectric material is deposited between adjacent nanotubes of the first layer of nanotubes to form a first low k dielectric film comprising the first layer of nanotubes comprising carbon in a matrix of the first low k dielectric material;
depositing an etch stop over the first low k dielectric film;
patterning the etch stop to define a vertical interconnect opening;
depositing a second catalytic seed layer over the etch stop;
depositing a second layer of nanotubes comprising carbon on the second catalytic seed layer;
depositing a second low k dielectric material such that at least a portion of the second low k dielectric material is deposited between adjacent nanotubes of the second layer of nanotubes to form a second low k dielectric film comprising the second layer of nanotubes comprising carbon in a matrix of the second low k dielectric material;
patterning a horizontal interconnect opening in the second low k dielectric film;
etching the first catalytic seed layer, the first layer of nanotubes, the etch stop, the second catalytic seed layer, and the second layer of nanotubes to form a horizontal interconnect and a vertical interconnect; and
depositing a conductive material to fill the horizontal interconnect and the vertical interconnect.

30. The method of claim 29, wherein the depositing the first and second low k dielectric material comprises a spin-on process.

31. The method of claim 29, wherein the first and second low k dielectric material are a porous oxide comprising silicon.

32. The method of claim 29, further comprising depositing a barrier layer in the horizontal interconnect and the vertical interconnect before the depositing a conductive material.

33. The method of claim 29, further comprising depositing a seed layer in the horizontal interconnect and the vertical interconnect before the depositing a conductive material.

34. A dual damascene structure, formed by a method comprising:

depositing a first catalytic seed layer on a substrate;

depositing a first layer of nanotubes comprising carbon on the first catalytic seed layer;

depositing a first low k dielectric material such that at least a portion of the first low k dielectric material is deposited between adjacent nanotubes of the first layer of nanotubes to form a first low k dielectric film comprising the first layer of nanotubes comprising carbon in a matrix of the first low k dielectric material;

depositing an etch stop over the first low k dielectric film;

patterning the etch stop to define a vertical interconnect opening;

depositing a second catalytic seed layer over the etch stop;

depositing a second layer of nanotubes comprising carbon on the second catalytic seed layer;

depositing a second low k dielectric material such that at least a portion of the second low k dielectric material is deposited between adjacent nanotubes of the second layer of nanotubes to form a second low k dielectric film comprising the second layer of nanotubes comprising carbon in a matrix of the second low k dielectric material;

patterning a horizontal interconnect opening in the second low k dielectric film;

etching the first catalytic seed layer, the first layer of nanotubes, the etch stop, the second catalytic seed layer, and the second layer of nanotubes to form a horizontal interconnect and a vertical interconnect; and depositing a conductive material to fill the horizontal interconnect and the vertical interconnect.

* * * * *

UNITED STATES PATENT AND TRADEMARK OFFICE
CERTIFICATE OF CORRECTION

PATENT NO. : 6,984,579 B2 Page 1 of 1
APPLICATION NO. : 10/376088
DATED : January 10, 2006
INVENTOR(S) : Son Van Nguyen and Kang Sub Yim It is certified that error appears in the above-identified patent and that said Letters Patent is hereby corrected as shown below:

In the Specification

Column 3, Line 12: Change "Endurae®" to --Endura®--

In the Claims

Column 6, Claim 1, Line 64: Change "law" to --low--

Column 7, Claim 2, Line 5: Change "at" to --of--

Column 7, Claim 2, Line 6: Change the comma to a semicolon

Column 7, Claim 17, Line 66: Change "or" to --of--

Column 8, Claim 29, Line 33: Change the comma to a semicolon

Column 8, Claim 30, Line 63: Change "material" to --materials--

Column 8, Claim 31, Line 66: Change "material" to --materials--

Signed and Sealed this

Twenty-first Day of November, 2006

JON W. DUDAS
*Director of the United States Patent and Trademark Office*